United States Patent
Wu et al.

(10) Patent No.: US 10,707,821 B1
(45) Date of Patent: Jul. 7, 2020

(54) RECEIVER CIRCUIT AND OPERATION METHOD

(71) Applicant: DigWise Technology Corporation, LTD, Hsinchu County (TW)

(72) Inventors: Jingjie Wu, Beijing (CN); Wen-Pin Hsieh, Hsinchu County (TW); Yu-Chieh Hung, Hsinchu County (TW)

(73) Assignee: DigWise Technology Corporation, LTD, Hsinchu County (TW)

( * ) Notice: Subject to any disclaimer, the term of this patent is extended or adjusted under 35 U.S.C. 154(b) by 0 days.

(21) Appl. No.: 16/579,817

(22) Filed: Sep. 23, 2019

(30) Foreign Application Priority Data

Aug. 21, 2019 (TW) .............................. 108129893 A

(51) Int. Cl.
*H03F 3/45* (2006.01)
*H03K 19/0185* (2006.01)
*H04L 25/02* (2006.01)

(52) U.S. Cl.
CPC . *H03F 3/45237* (2013.01); *H03K 19/018514* (2013.01); *H04L 25/0272* (2013.01); *H04L 25/0292* (2013.01)

(58) Field of Classification Search
CPC ........ H03F 3/45237; H03K 19/018514; H04L 25/0272; H04L 25/0292
See application file for complete search history.

(56) References Cited

U.S. PATENT DOCUMENTS

| 5,539,333 | A | 7/1996 | Cao et al. |
| 6,111,437 | A * | 8/2000 | Patel .................... H03K 5/2481 327/407 |
| 7,176,720 | B1 | 2/2007 | Prather et al. |
| 7,372,331 | B2 | 5/2008 | Menczigar et al. |
| 7,639,043 | B2 | 12/2009 | Koike |
| 9,407,243 | B1 | 8/2016 | Wang et al. |
| 9,767,888 | B1 | 9/2017 | Ravi et al. |
| 10,193,555 | B1 | 1/2019 | Naviasky et al. |
| 2015/0229300 | A1 | 8/2015 | Hwang |
| 2019/0132428 | A1 | 5/2019 | Chalasani et al. |

FOREIGN PATENT DOCUMENTS

| CN | 206807421 U | 12/2017 |
| TW | I599886 B | 9/2017 |

* cited by examiner

Primary Examiner — John W Poos
(74) Attorney, Agent, or Firm — CKC & Partners Co., LLC

(57) ABSTRACT

A receiver circuit includes a first amplifier circuit, a second amplifier circuit, and a selector circuit. The first amplifier circuit is configured to receive a pair of receiving signals. The second amplifier circuit is configured to receive the pair of receiving signals. Based on a selection signal, the first amplifier circuit generates a pair of first amplifying signals according to the pair of receiving signals or the second amplifier circuit generates a pair of second amplifying signals according to the pair of receiving signals. The selector circuit is configured to output the pair of first amplifying signals or the pair of second amplifying signals according to the selection signal.

15 Claims, 5 Drawing Sheets

RECEIVER CIRCUIT AND OPERATION METHOD

RELATED APPLICATIONS

This application claims priority to Taiwanese Application Serial Number 108129893, filed Aug. 21, 2019, which is herein incorporated by reference.

BACKGROUND

Technical Field

The present disclosure relates to a circuit technology. More particularly, the present disclosure relates to a receiver circuit that may be applied for different transmission formats.

Description of Related Art

In the communication technology, transmitter devices may transmit signals to receiver devices through different transmission formats. However, the signals transmitted through the different transmission formats have different characteristics (for example, different voltage levels). Thus, the receiver circuits for the different transmission formats are different.

SUMMARY

Some aspects of the present disclosure are to provide a receiver circuit that includes a first amplifier circuit, a second amplifier circuit, and a selector circuit. The first amplifier circuit is configured to receive a pair of receiving signals. The second amplifier circuit is configured to receive the pair of receiving signals. Based on a selection signal, the first amplifier circuit generates a pair of first amplifying signals according to the pair of receiving signals or the second amplifier circuit generates a pair of second amplifying signals according to the pair of receiving signals. The selector circuit is configured to output the pair of first amplifying signals or the pair of second amplifying signals according to the selection signal.

Some aspects of the present disclosure are to provide a receiver circuit that includes a first amplifier circuit, a second amplifier circuit, a level shifter circuit, a latch circuit, and a selector circuit. The first amplifier circuit is configured to receive a pair of receiving signals. The second amplifier circuit is configured to receive the pair of receiving signals. Based on a selection signal, the first amplifier circuit generates a pair of first amplifying signals according to the pair of receiving signals or the second amplifier circuit generates a pair of second amplifying signals according to the pair of receiving signals. The level shifter circuit is configured to generate a pair of first level shifting signals or a pair of second level shifting signals according to the pair of first amplifying signals or the pair of second amplifying signals. The latch circuit is configured to generate a pair of first latching signals or a pair of second latching signals according the pair of first level shifting signals or the pair of second level shifting signals. The selector circuit is configured to output the pair of first latching signals or the pair of second latching signals according to the selection signal.

Some aspects of the present disclosure are to provide an operation method of a receiver circuit. The operation method includes: receiving a pair of receiving signals by a first amplifier circuit; receiving the pair of receiving signals by a second amplifier circuit; based on a selection signal, generating a pair of first amplifying signals according to the pair of receiving signals by the first amplifier circuit or generating a pair of second amplifying signals according to the pair of receiving signals by the second amplifier circuit; and outputting the pair of first amplifying signals or the pair of second amplifying signals according to the selection signal by a selector circuit.

As described above, the receiver circuit of the present disclosure may be applied for different transmission formats.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present embodiments. Furthermore, for simplifying the drawings, some of the conventional structures and elements are shown with schematic illustrations.

In the present disclosure, "connected" or "coupled" may refer to "electrically connected" or "electrically coupled." "Connected" or "coupled" may also refer to operations or actions between two or more elements.

Figure 1:
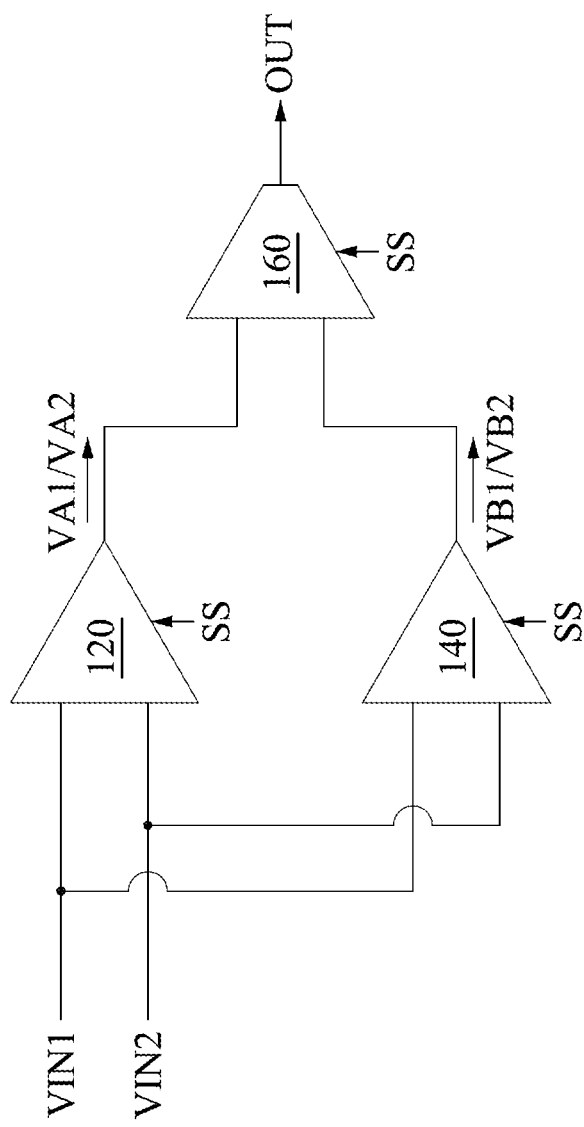
FIG. 1 is a schematic diagram of a receiver circuit according to some embodiments of the present disclosure.

Reference is made to FIG. 1. FIG. 1 is a schematic diagram of a receiver circuit 100 according to some embodiments of the present disclosure. In some embodiments, the receiver circuit 100 is disposed in a receiver device. The receiver circuit 100 of the receiver device may receive transmission signals transmitted through different transmission formats. As illustrated in FIG. 1, the receiver circuit 100 includes an amplifier circuit 120, an amplifier circuit 140, and a selector circuit 160. The amplifier circuit 120 and the amplifier circuit 140 are coupled to the selector circuit 160.

In some embodiments, the amplifier circuit 120 and the amplifier circuit 140 receive receiving signals VIN1/VIN2 from a transmitter device. The amplifier circuit 120 and the amplifier circuit 140 are controlled by a selection signal SS to respectively generate amplifying signals VA1/VA2 and amplifying signals VB1/VB2. The selector circuit 160 is controlled by the selection signal SS to output the amplifying signals VA1/VA2 or the amplifying signals VB1/VB2.

For example, the amplifier circuit 140 is controlled to be shut down by the selection signal SS having a first state (for example, a high voltage level) when the amplifier circuit 120 is controlled to have electrical power by the selection signal SS having the first state. Accordingly, the amplifier circuit 120 generates the amplifying signals VA1/VA2 according to the receiving signals VIN1/VIN2 and the amplifier circuit 140 stops outputting the amplifying signals VB1/VB2. The selector circuit 160 outputs the amplifying signals VA1/VA2 to be an output signal OUT according to the selection signal SS having the first state.

On the contrary, the amplifier circuit 120 is controlled to be shut down by the selection signal SS having a second state (for example, a low voltage level) when the amplifier circuit 140 is controlled to have electrical power by the selection signal SS having the second state. Accordingly, the amplifier circuit 140 generates the amplifying signals VB1/VB2 according to the receiving signals VIN1/VIN2 and the amplifier circuit 120 stops outputting the amplifying signals VA1/VA2. The selector circuit 160 outputs the amplifying signals VB1/VB2 to be the output signal OUT according to the selection signal SS having the second state.

In some embodiments, the receiving signal VIN1 is opposite to the receiving signal VIN2. For example, the receiving signal VIN1 may be +1 volt and the receiving signal VIN2 may be −1 volt. In some other embodiments, one of the receiving signal VIN1 and the receiving signal VIN2 may be a constant voltage.

In communication standard and based on voltage levels of transmission signals, P-type transistors are utilized to be elements configured to receive receiving signals for some transmission formats, and N-type transistors are utilized to be elements configured to receive receiving signals for some transmission formats. For example, P-type transistors are utilized to be elements configured to receive receiving signals for a transmission format LPDDR4, and N-type transistors are utilized to be elements configured to receive receiving signals for a transmission format LPDDR2, LPDDR3, DDR3, or DDR4. Based on above, the amplifier circuit 120 may utilize P-type transistors to be elements configured to receive the receiving signals VIN1/VIN2 and the amplifier circuit 140 may utilize N-type transistors to be elements configured to receive the receiving signals VIN1/VIN2. Thus, the receiver circuit 100 may be applied for different transmission formats.

Figure 2:
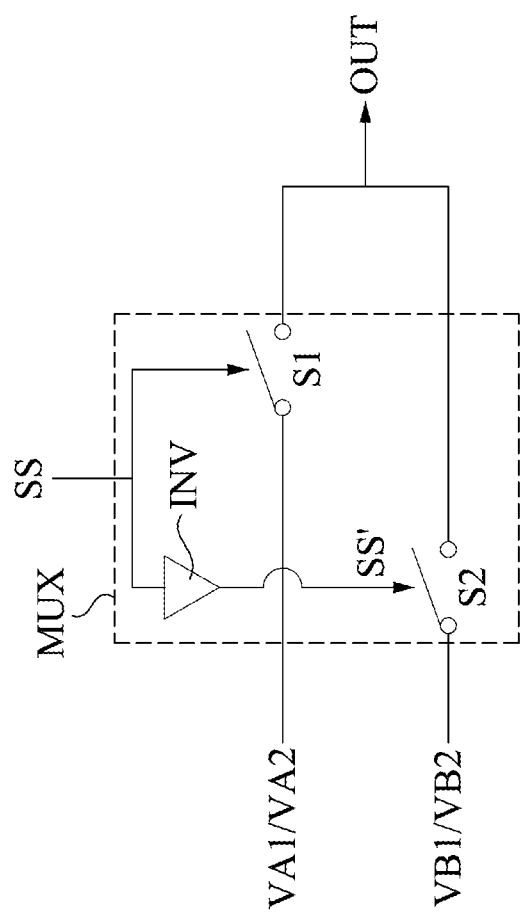
FIG. 2 is a circuit diagram of a selector circuit according to some embodiments of the present disclosure.

Reference is made to FIG. 2. FIG. 2 is a circuit diagram of the selector circuit 160 according to some embodiments of the present disclosure.

In some embodiments, the selector circuit 160 includes a multiplexer MUX. Input terminals of the multiplexer MUX receive the amplifying signals VA1/VA2 from the amplifier circuit 120 and the amplifying signals VB1/VB2 from the amplifier circuit 140. An output terminal of the multiplexer MUX is configured to output the amplifying signals VA1/VA2 or the amplifying signals VB1/VB2 to be the output signal OUT according to the selection signal SS.

In some embodiments, the multiplexer MUX includes a switch S1, a switch S2, and an inverter INV. A first terminal of the switch S1 is coupled to the amplifier circuit 120 in FIG. 1 to receive the amplifying signals VA1/VA2 from the amplifier circuit 120. A first terminal of the switch S2 is coupled to the amplifier circuit 140 in FIG. 1 to receive the amplifying signals VB1/VB2 from the amplifier circuit 140. A second terminal of the switch S1 is coupled to a second terminal of the switch S2. The switch S1 is controlled by the selection signal SS. The selection signal SS is inverted by the inverter INV to generate an inverted selection signal SS'. The switch S2 is controlled by the inverted selection signal SS'. The switch S1 outputs the amplifying signals VA1/VA2 when the switch S1 is controlled to be turned on by the selection signal SS. Under this condition, the switch S2 is controlled to be turned off by the inverted selection signal SS'. On the contrary, the switch S2 outputs the amplifying signals VB1/VB2 when the switch S2 is controlled to be turned on by the inverted selection signal SS'. Under this condition, the switch S1 is controlled to be turned off by the selection signal SS.

Figure 3:
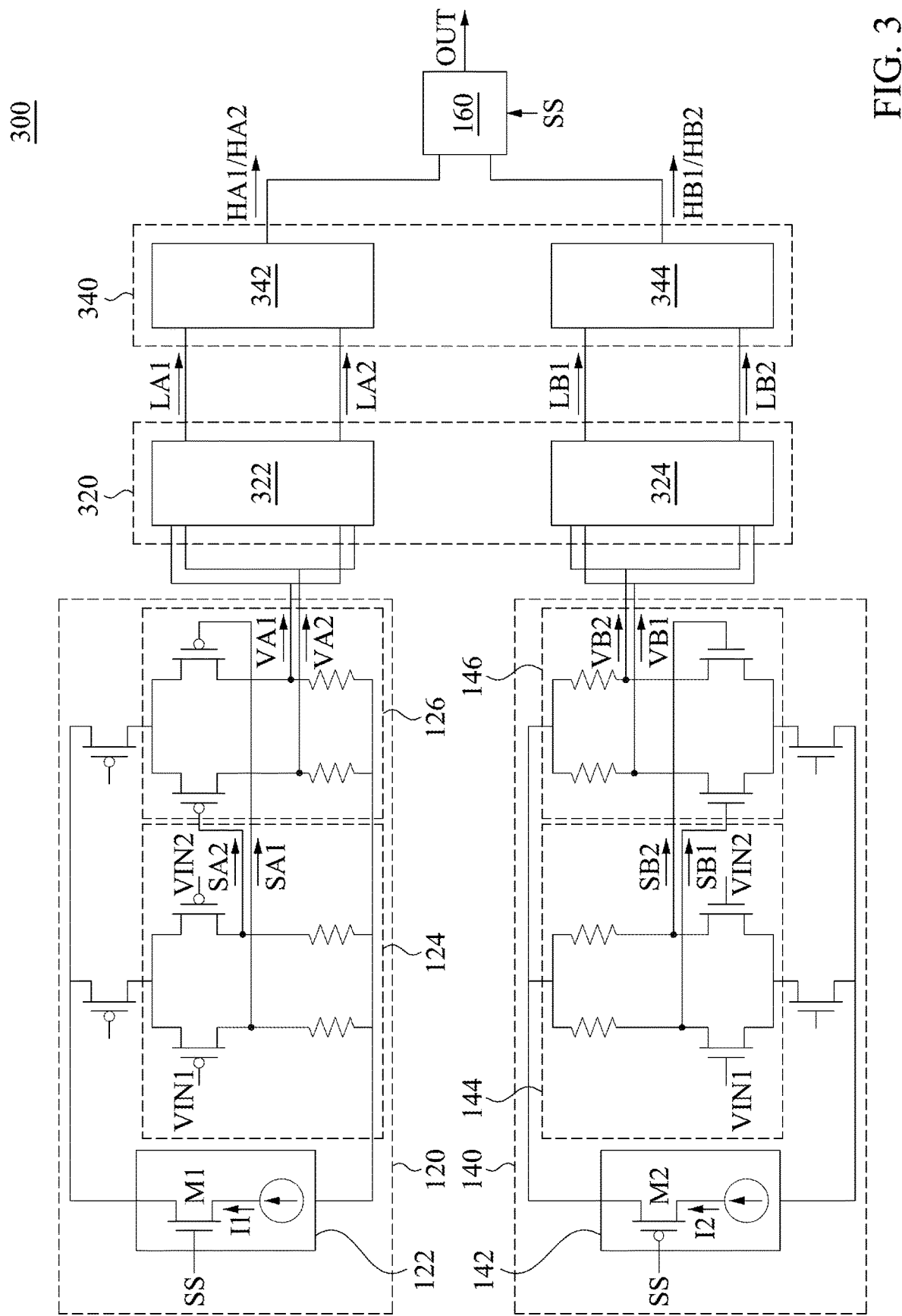
FIG. 3 is a circuit diagram of a receiver circuit according to some embodiments of the present disclosure.

Reference is made to FIG. 3. FIG. 3 is a circuit diagram of a receiver circuit 300 according to some embodiments of the present disclosure. With respect to the embodiments of FIG. 1, like elements in FIG. 3 are designated with the same reference numbers for ease of understanding.

A difference between the receiver circuit 300 in FIG. 3 and the receiver circuit 100 in FIG. 1 is that the receiver circuit 300 in FIG. 3 further includes a level shifter circuit 320 and a latch circuit 340. In other words, the receiver circuit 300 includes the amplifier circuit 120, the amplifier circuit 140, the level shifter circuit 320, the latch circuit 340, and the selector circuit 160. The level shifter circuit 320 is coupled to the amplifier circuit 120 and the amplifier circuit 140. The latch circuit 340 is coupled to the level shifter circuit 320 and the selector circuit 160.

In some embodiments, the amplifier circuit 120 includes a current source 122, a first stage amplifier 124, and a second stage amplifier 126. The first stage amplifier 124 is coupled to the current source 122. The second stage amplifier 126 is coupled to the first stage amplifier 124. In some embodiments, the amplifier circuit 140 includes a current source 142, a first stage amplifier 144, and a second stage amplifier 146. The first stage amplifier 144 is coupled to the current source 142. The second stage amplifier 146 is coupled to the first stage amplifier 144. In some embodiments, each of the current source 122 and the current source 142 is implemented by a current mirror circuit, but the present disclosure is not limited thereto.

A transistor M1 of the current source 122 of the amplifier circuit 120 is turned on according to the selection signal SS and the current source 122 outputs a constant current I1 when the selection signal SS has the first state (for example, the high voltage level). As described above, the first stage amplifier 124 utilizes the P-type transistors to be elements configured to receive the receiving signals VIN1/VIN2. The first stage amplifier 124 generates first stage output signals SA1/SA2 according to the constant current I1 and the receiving signals VIN1/VIN2. The second stage amplifier 126 generates the amplifying signals VA1/VA2 according to the first stage output signals SA1/SA2. Under this condition, a transistor M2 of the current source 142 of the amplifier circuit 140 is turned off according to the selection signal SS. Accordingly, the current source 142 stops outputting a constant current I2, such that the amplifier circuit 140 is shut down and stops outputting the amplifying signals VB1/VB2.

On the contrary, the transistor M2 of the current source 142 of the amplifier circuit 140 is turned on according to the selection signal SS and the current source 142 outputs the constant current I2 when the selection signal SS has the second state (for example, the low voltage level). As described above, the first stage amplifier 144 utilizes the N-type transistors to be elements configured to receive the receiving signals VIN1/VIN2. The first stage amplifier 144 generates first stage output signals SB1/SB2 according to the constant current I2 and the receiving signals VIN1/VIN2. The second stage amplifier 146 generates the amplifying signals VB1/VB2 according to the first stage output signals SB1/SB2. Under this condition, the transistor M1 of the current source 122 of the amplifier circuit 120 is turned off according to the selection signal SS. Accordingly, the current source 122 stops outputting the constant current I1, such that the amplifier circuit 120 is shut down and stops outputting the amplifying signals VA1/VA2.

In some embodiments, the level shifter circuit 320 generates level shifting signals LA1/LA2 or level shifting signals LB1/LB2 according to the amplifying signals VA1/VA2 or the amplifying signals VB1/VB2. Specifically, the level shifter circuit 320 includes a level shifter 322 and a level shifter 324. The level shifter 322 is coupled to the amplifier circuit 120 to receive the amplifying signals VA1/VA2. The level shifter 324 is coupled to the amplifier circuit 140 to receive the amplifying signals VB1/VB2.

In some embodiments, each of the level shifter 322 and the level shifter 324 includes four input terminals and two output terminals. Specifically, the input terminals of the level shifter 322 receive the amplifying signals VA1/VA2 and output terminals of the level shifter 322 output level shifting signals LA1/LA2 when the amplifier circuit 120 outputs the amplifying signals VA1/VA2 according to the selection signal SS having the first state. Similarly, the input terminals of the level shifter 324 receive the amplifying signals VB1/VB2 and output terminals of the level shifter 324 output level shifting signals LB1/LB2 when the amplifier circuit 140 outputs the amplifying signals VB1/VB2 according to the selection signal SS having the second state.

In some embodiments, the latch circuit 340 generates latching signals HA1/HA2 or latching signals HB1/HB2 according to the level shifting signals LA1/LA2 or the level shifting signals LB1/LB2. Specifically, the latch circuit 340 includes a latch 342 and a latch 344. The latch 342 receives the level shifting signals LA1/LA2 and generates the latching signals HA1/HA2 when the level shifter 322 outputs the level shifting signals LA1/LA2. The latch 344 receives the level shifting signals LB1/LB2 and generates the latching signals HB1/HB2 when the level shifter 324 outputs the level shifting signals LB1/LB2. The selector circuit 160 outputs the latching signals HA1/HA2 or the latching signals HB1/HB2 according to the selection signal SS. For example, the selector circuit 160 outputs the latching signals HA1/HA2 according to the selection signal SS having the first state (for example, the high voltage level), and the selector circuit 160 outputs the latching signals HB1/HB2 according to the selection signal SS having the second state (for example, the low voltage level).

Figure 4:
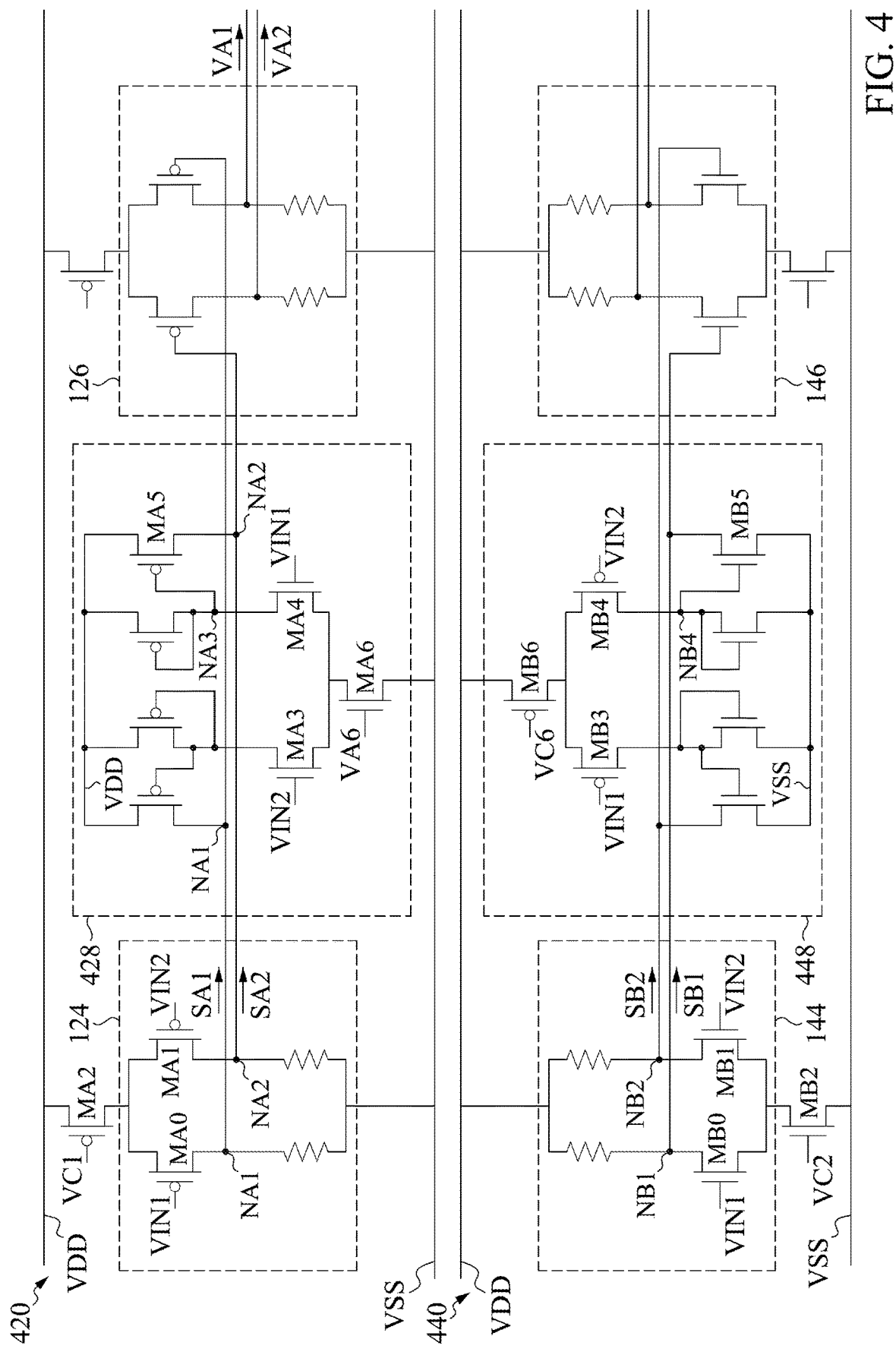
FIG. 4 is a circuit diagram of two amplifier circuits according to some embodiments of the present disclosure.

Reference is made to FIG. 4. FIG. 4 is a circuit diagram of an amplifier circuit 420 and an amplifier circuit 440 according to some embodiments of the present disclosure. In some embodiments, the amplifier circuit 420 is configured to implement the amplifier circuit 120 in FIG. 1 and the amplifier circuit 440 is configured to implement the amplifier circuit 140 in FIG. 1. With respect to the embodiments of FIG. 3, like elements in FIG. 4 are designated with the same reference numbers for ease of understanding.

As illustrated in FIG. 4, a difference between the amplifier circuit 420 in FIG. 4 and the amplifier circuit 120 in FIG. 3 is that the amplifier circuit 420 in FIG. 4 further includes an adjusting circuit 428. The adjusting circuit 428 is coupled between the first stage amplifier 124 and the second stage amplifier 126. The adjusting circuit 428 is also coupled between a voltage VDD and a voltage VSS. The adjusting circuit 428 adjusts a voltage level of at least one of the first stage output signals SA1/SA2 according to the receiving signals VIN1/VIN2. In addition, a difference between the amplifier circuit 440 in FIG. 4 and the amplifier circuit 140 in FIG. 3 is that the amplifier circuit 440 in FIG. 4 further includes an adjusting circuit 448. The adjusting circuit 448 is coupled between the first stage amplifier 144 and the second stage amplifier 146. The adjusting circuit 448 is also coupled between the voltage VDD and the voltage VSS. The adjusting circuit 448 adjusts a voltage level of at least one of the first stage output signals SB1/SB2 according to the receiving signals VIN1/VIN2. In some embodiments, the voltage VDD has a high voltage level (for example, a power voltage) and the voltage VSS has a low voltage level (for example, a ground voltage).

For the adjusting circuit 428, a transistor MA0 is turned off, a transistor MA1 is turned on, a transistor MA4 is turned on, and a transistor MA3 is turned off when the receiving signal VIN1 has the high voltage level and the receiving signal VIN2 has the low voltage level. Under a condition that a transistor MA2 is controlled to be turned on by a control voltage VC1, a voltage level at a node NA1 is pulled down based on the voltage VSS since the transistor MA0 is turned off. A voltage level at a node NA2 is maintained to be high based on the voltage VDD since the transistor MA1 is turned on. In addition, under a condition that a transistor MA6 is controlled to be turned on by a control voltage VA6, a voltage level at a node NA3 is pulled down based on the voltage VSS since the transistor MA4 is turned on. Accordingly, a transistor MA5 is turned on. The voltage level at the node NA2 is pulled up based on the voltage VDD since the transistor MA5 is turned on. Accordingly, a voltage level of the first stage amplifying signal SA2 is pulled up. Thus, the adjusting circuit 428 may work in coordination with the transistor MA1 to pull up the voltage level at the node NA2, to enhance the circuit efficiency.

Similarly, for the adjusting circuit 448, a transistor MB0 is turned on, a transistor MB1 is turned off, a transistor MB3 is turned off, and a transistor MB4 is turned on when the receiving signal VIN1 has the high voltage level and the receiving signal VIN2 has the low voltage level. Under a condition that a transistor MB2 is controlled to be turned on by a control voltage VC2, a voltage level at a node NB1 is pulled down based on the voltage VSS since the transistor MB0 is turned on. A voltage level at a node NB2 is maintained to be high based on the voltage VDD since the transistor MB1 is turned off. In addition, under a condition that a transistor MB6 is controlled to be turned on by a control voltage VC6, a voltage level at a node NA4 is maintained to be high based on the voltage VDD since the transistor MB4 is turned on. Accordingly, a transistor MB5 is turned on. The voltage level at the node NB1 is pulled down since the transistor MB5 is turned on. Accordingly, a voltage level of the first stage amplifying signal SB1 is pulled down based on the voltage VSS. Thus, the adjusting circuit 448 may work in coordination with the transistor MB0 to pull down the voltage level at the node NB1, to enhance the circuit efficiency.

Figure 5:
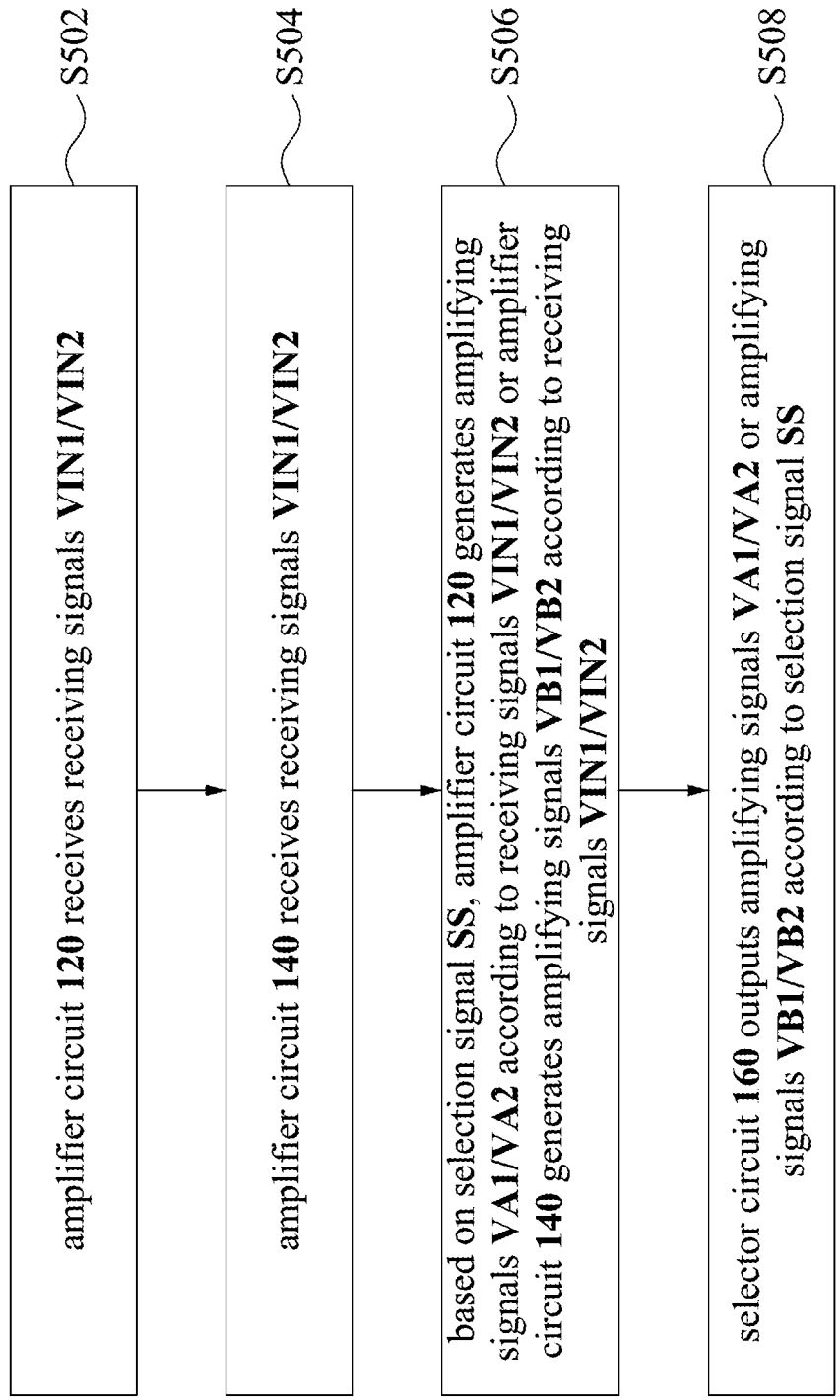
FIG. 5 is a flow diagram illustrating an operation method of a receiver circuit according to some embodiments of the present disclosure.

Reference is made to FIG. 5. FIG. 5 is a flow diagram illustrating an operation method 500 of a receiver circuit according to some embodiments of the present disclosure. In some embodiments, the operation method 500 is implemented in the receiver circuit 100 in FIG. 1, but the present disclosure is not limited thereto. For ease of understanding, the operation method 500 is described with FIG. 1.

In operation S502, the amplifier circuit 120 receives the receiving signals VIN1/VIN2. In some embodiments, the amplifier circuit 120 utilizes the P-type transistors to be elements configured to receive the receiving signals VIN1/VIN2, to operate in coordination with some transmission formats. One of the transmission formats is, for example, LPDDR4, but the present disclosure is not limited thereto.

In operation S504, the amplifier circuit 140 receives the receiving signals VIN1/VIN2. In some embodiments, the amplifier circuit 140 utilizes the N-type transistors to be elements configured to receive the receiving signals VIN1/VIN2, to operate in coordination with some transmission formats. One of the transmission formats is, for example, LPDDR2, LPDDR3, DDR3, or DDR4, but the present disclosure is not limited thereto.

In operation S506, based on the selection signal SS, the amplifier circuit 120 generates the amplifying signals VA1/VA2 according to the receiving signals VIN1/VIN2 or the amplifier circuit 140 generates the amplifying signals VB1/VB2 according to the receiving signals VIN1/VIN2. In some embodiments, the amplifier circuit 120 generates the amplifying signals VA1/VA2 according to the receiving signals VIN1/VIN2 when the selection signal SS has the first state (for example, the high voltage level). On the contrary, the amplifier circuit 140 generates the amplifying signals VB1/VB2 according to the receiving signals VIN1/VIN2 when the selection signal SS has the second state (for example, the low voltage level).

In operation S508, the selector circuit 160 outputs the amplifying signals VA1/VA2 or the amplifying signals VB1/VB2 according to the selection signal SS. In some embodiments, the selector circuit 160 outputs the amplifying signals VA1/VA2 when the selection signal SS has the first state. On the contrary, the selector circuit 160 outputs the amplifying signals VB1/VB2 when the selection signal SS has the second state.

As described above, the receiver circuit of the present disclosure may be applied for different transmission formats.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A receiver circuit, comprising:
   a first amplifier circuit configured to receive a pair of receiving signals;
   a second amplifier circuit configured to receive the pair of receiving signals, wherein based on a selection signal, the first amplifier circuit generates a pair of first amplifying signals according to the pair of receiving signals or the second amplifier circuit generates a pair of second amplifying signals according to the pair of receiving signals; and
   a selector circuit configured to output the pair of first amplifying signals or the pair of second amplifying signals according to the selection signal,
   wherein when the selection signal has a first state, the first amplifier circuit generates the pair of first amplifying signals according the selection signal, the second amplifier circuit is shut down, and the selector circuit outputs the pair of first amplifying signals according to the selection signal, wherein when the selection signal has a second state, the first amplifier circuit is shut down, the second amplifier circuit generates the pair of second amplifying signals according the selection signal, and the selector circuit outputs the pair of second amplifying signals according to the selection signal.

2. The receiver circuit of claim 1, wherein the first amplifier circuit comprises:
   a current source configured to output a constant current when the selection signal has the first state;
   a first stage amplifier coupled to the current source, wherein the first stage amplifier is configured to generate a pair of first stage output signals according to the constant current and the pair of receiving signals; and
   a second stage amplifier coupled to the first stage amplifier, wherein the second stage amplifier is configured to generate the pair of first amplifying signals according to the pair of first stage output signals.

3. The receiver circuit of claim 2, wherein a transistor of the current source is turned off according to the selection signal when the selection signal has the second state, such that the first amplifier circuit is shut down and stops outputting the pair of first amplifying signals.

4. The receiver circuit of claim 2, wherein the first amplifier circuit further comprises:
   an adjusting circuit coupled between the first stage amplifier and the second stage amplifier, wherein the adjusting circuit is configured to adjust a voltage level of at least one of the pair of first stage output signals according to the pair of receiving signals.

5. The receiver circuit of claim 1, wherein the second amplifier circuit comprises:
   a current source configured to output a constant current when the selection signal has the second state;
   a first stage amplifier coupled to the current source, wherein the first stage amplifier is configured to generate a pair of first stage output signals according to the constant current and the pair of receiving signals; and
   a second stage amplifier coupled to the first stage amplifier, wherein the second stage amplifier is configured to generate the pair of second amplifying signals according to the pair of first stage output signals.

6. The receiver circuit of claim 5, wherein a transistor of the current source is turned off according to the selection signal when the selection signal has the first state, such that the second amplifier circuit is shut down and stops outputting the pair of second amplifying signals.

7. The receiver circuit of claim 5, wherein the second amplifier circuit further comprises:
   an adjusting circuit coupled between the first stage amplifier and the second stage amplifier, wherein the adjusting circuit is configured to adjust a voltage level of at least one of the pair of first stage output signals according to the pair of receiving signals.

8. The receiver circuit of claim 1, wherein the first state is corresponding to a first transmission format and the second state is corresponding to a second transmission format.

9. The receiver circuit of claim 8, wherein the first transmission format is LPDDR4 and the second transmission format is LPDDR2, LPDDR3, DDR3, or DDR4.

10. The receiver circuit of claim 1, wherein the selector circuit comprises a multiplexer, and the multiplexer is configured to output the pair of first amplifying signals or the pair of second amplifying signals according to the selection signal.

11. The receiver circuit of claim 1, wherein the selector circuit comprises a first switch and a second switch, the first switch is coupled to the first amplifier circuit, and the second switch is coupled to the second amplifier circuit, wherein when the first switch is turned on according to the selection signal, the first switch outputs the pair of first amplifying signals and the second switch is turned off according to the selection signal, wherein when the second switch is turned on according to the selection signal, the second switch outputs the pair of second amplifying signals and the first switch is turned off according to the selection signal.

12. A receiver circuit, comprising:
a first amplifier circuit configured to receive a pair of receiving signals;
a second amplifier circuit configured to receive the pair of receiving signals, wherein based on a selection signal, the first amplifier circuit generates a pair of first amplifying signals according to the pair of receiving signals or the second amplifier circuit generates a pair of second amplifying signals according to the pair of receiving signals;
a level shifter circuit configured to generate a pair of first level shifting signals or a pair of second level shifting signals according to the pair of first amplifying signals or the pair of second amplifying signals;
a latch circuit configured to generate a pair of first latching signals or a pair of second latching signals according the pair of first level shifting signals or the pair of second level shifting signals; and
a selector circuit configured to output the pair of first latching signals or the pair of second latching signals according to the selection signal.

13. The receiver circuit of claim 12, wherein the level shifter circuit comprises:
a first level shifter coupled to the first amplifier circuit; and
a second level shifter coupled to the second amplifier circuit;
wherein each of the first level shifter and the second level shifter comprises four input terminals and two output terminals, wherein the input terminals of first level shifter are configured to receive the pair of first amplifying signals and the output terminals of the first level shifter are configured to output the pair of first level shifting signals, wherein the input terminals of second level shifter are configured to receive the pair of second amplifying signals and the output terminals of the second level shifter are configured to output the pair of second level shifting signals.

14. The receiver circuit of claim 12, wherein the first amplifier circuit is corresponding to LPDDR4 and the second amplifier circuit is corresponding to LPDDR2, LPDDR3, DDR3, or DDR4.

15. An operation method of a receiver circuit, comprises:
receiving a pair of receiving signals by a first amplifier circuit;
receiving the pair of receiving signals by a second amplifier circuit,
when the selection signal has a first state, generating the pair of first amplifying signals according to the pair of receiving signals by the first amplifier circuit, and outputting the pair of first amplifying signals according to the selection signal by a selector circuit, wherein the second amplifier circuit is shut down; and
generating the pair of second amplifying signals according to the pair of receiving signals by the second amplifier circuit when the selection signal has a second state, and outputting the pair of second amplifying signals according to the selection signal by the selector circuit, wherein the first amplifier circuit is shut down.

* * * * *